(12) United States Patent
Curatolo

(10) Patent No.: US 10,483,844 B2
(45) Date of Patent: Nov. 19, 2019

(54) CHARGE PUMP ARRANGEMENT AND METHOD FOR OPERATING A CHARGE PUMP ARRANGEMENT

(71) Applicant: Infineon Technologies AG, Neubiberg (DE)

(72) Inventor: Giacomo Curatolo, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/851,768

(22) Filed: Dec. 22, 2017

(65) Prior Publication Data

US 2018/0183327 A1 Jun. 28, 2018

(30) Foreign Application Priority Data

Dec. 28, 2016 (DE) .......................... 10 2016 125 757

(51) Int. Cl.
*H02M 3/07* (2006.01)
*G11C 5/14* (2006.01)

(52) U.S. Cl.
CPC ............... *H02M 3/07* (2013.01); *G11C 5/145* (2013.01)

(58) Field of Classification Search
CPC .. H02M 3/07; H02M 3/073; H02M 2003/075; H02M 2003/076; G11C 5/145
See application file for complete search history.

(56) References Cited

U.S. PATENT DOCUMENTS

| 4,527,180 A | 7/1985 | Oto |
| 5,563,779 A | 10/1996 | Cave et al. |
| 6,259,612 B1 * | 7/2001 | Itoh .......................... H02M 3/07 327/536 |
| 6,411,069 B1 | 6/2002 | Hollmer |
| 6,859,091 B1 | 2/2005 | Nicholson et al. |
| 6,927,620 B2 * | 8/2005 | Senda ................... H02M 3/073 327/536 |
| 2007/0285151 A1 | 12/2007 | Fujiwara |
| 2009/0102544 A1 * | 4/2009 | Okamoto ............... G11C 5/145 327/540 |
| 2013/0015831 A1 * | 1/2013 | Wong ....................... H01G 5/40 323/282 |
| 2014/0091773 A1 | 4/2014 | Burlingame et al. |
| 2016/0181913 A1 * | 6/2016 | Feng ........................ H02M 3/07 327/536 |

FOREIGN PATENT DOCUMENTS

| CN | 1477773 A | 2/2004 |
| CN | 101087104 A | 12/2007 |
| CN | 101272090 A | 9/2008 |
| CN | 104518663 A | 4/2015 |

* cited by examiner

*Primary Examiner* — Jung Kim

(74) *Attorney, Agent, or Firm* — Viering, Jentschura & Partner MBB

(57) ABSTRACT

A charge pump arrangement and methods for operating a charge pump arrangement are disclosed. According to various embodiments, a charge pump arrangement may include: a charge pump circuit configured to convert an input voltage into an output voltage based on a pump clock signal; a feedback path configured to provide a feedback signal representing the output voltage of the charge pump circuit; and a control circuit configured to receive a clock signal and to control the output voltage of the charge pump circuit by controlling the pump clock signal based on the feedback signal and the clock signal.

12 Claims, 10 Drawing Sheets

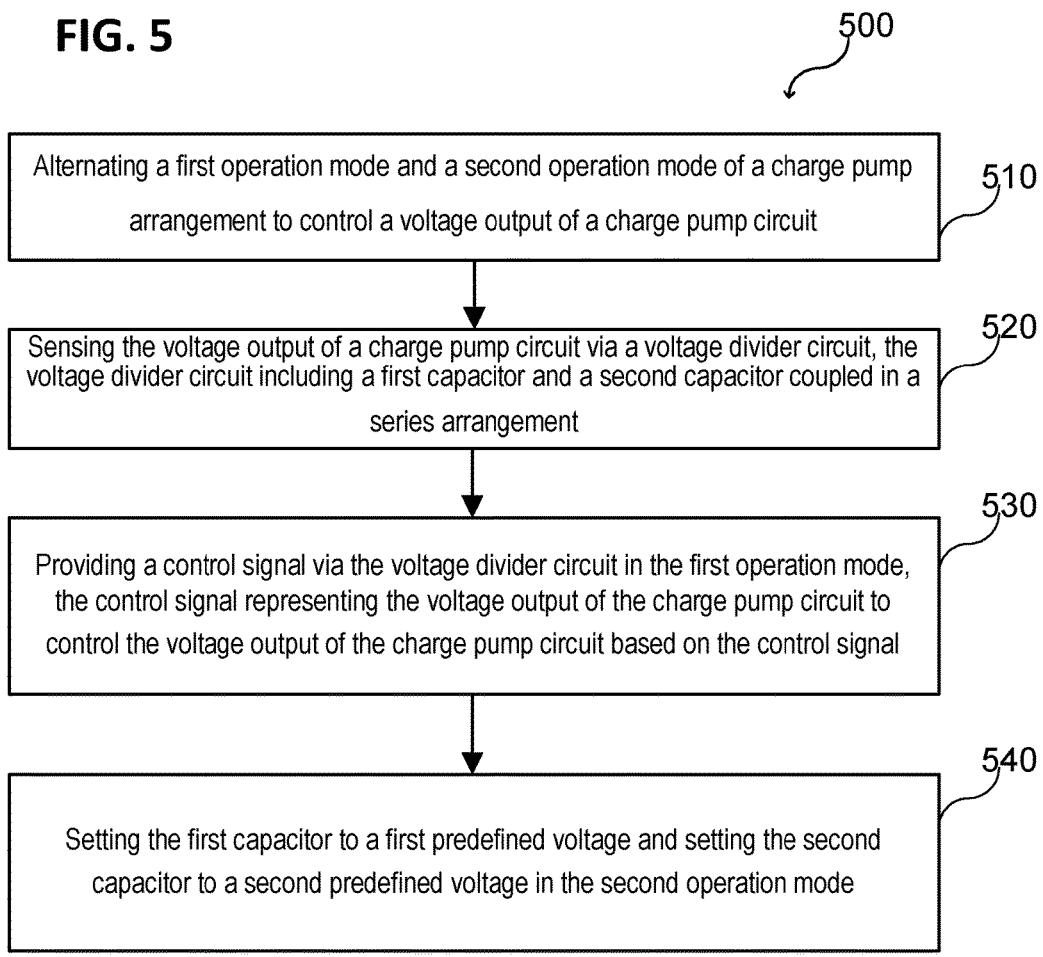

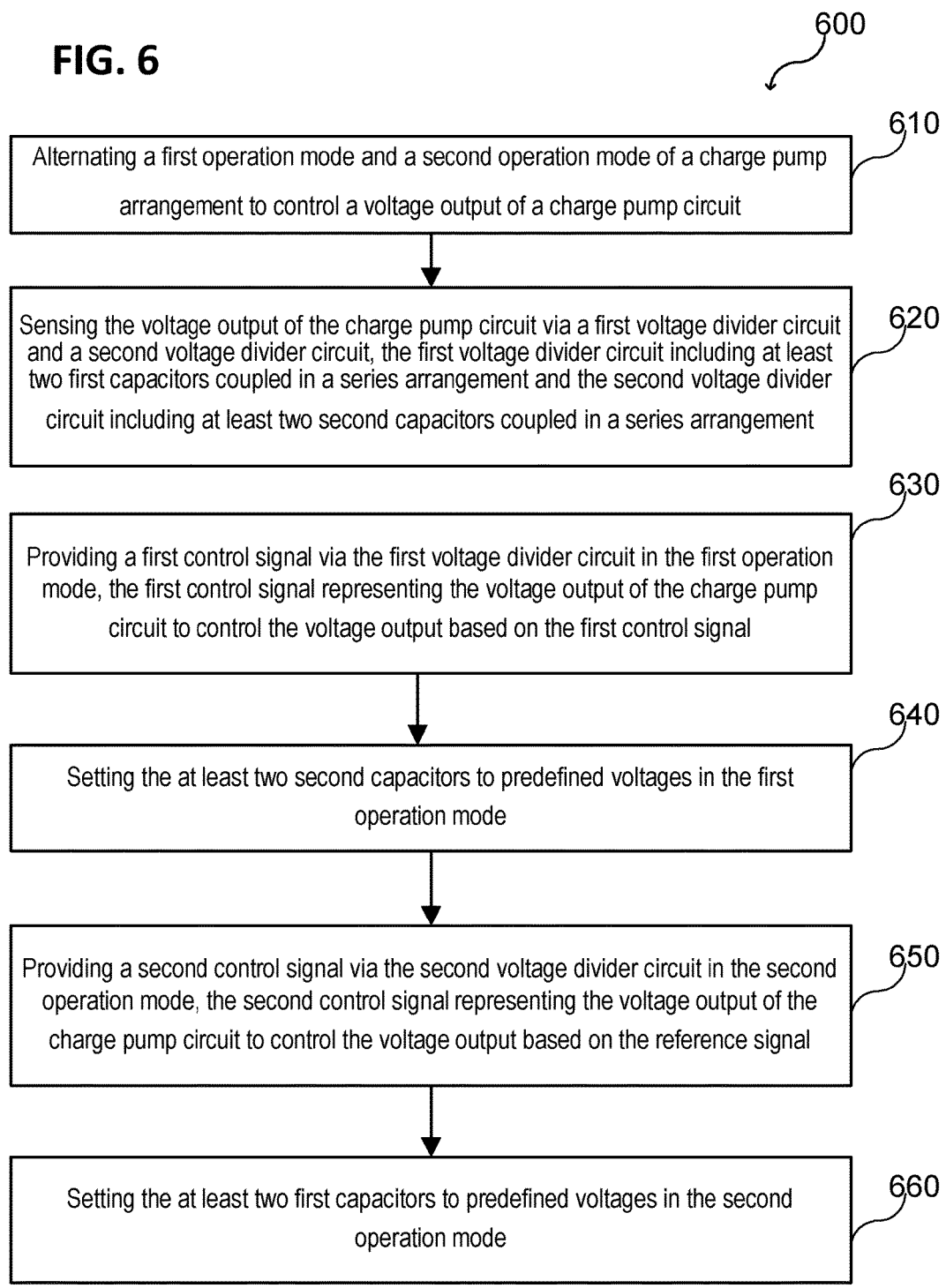

CHARGE PUMP ARRANGEMENT AND METHOD FOR OPERATING A CHARGE PUMP ARRANGEMENT

CROSS-REFERENCE TO RELATED APPLICATION

This application claims priority to German Patent Application Serial No. 10 2016 125 757.5, which was filed Dec. 28, 2016, and is incorporated herein by reference in its entirety.

TECHNICAL FIELD

Various embodiments relate generally to a charge pump arrangement and a method for operating a charge pump arrangement.

BACKGROUND

In general, a charge pump may be part of various types of electronic circuits in which higher voltages than the input voltage may be required or in which a voltage shall be provided with a variable reference potential. A charge pump may include an electrical circuit that is configured to increase an electrical voltage or to invert an electrical DC voltage in polarity. A charge pump may transport electrical charge by means of electrical capacitors and by a periodic switching of switches, which allows to generate differently high electrical output voltages. The input voltage that may be converted by the charge pump may include an AC and/or a DC voltage, wherein the output voltage of the charge pump is a DC voltage. A charge pump may include one or more capacitors as energy-storage elements to create either a higher- or lower-voltage power source. Further, a charge pump circuit may be designed to operate with high energy efficiency, e.g. up to 95%. Additionally, it may be desired to keep the design of the charge pump circuit simple. General design concepts for charge pump circuits may be the so called Bootstrap design and the so called Dickson design, however, there may be a large number of variants of charge pump circuit designs. A charge pump circuit used for example in semiconductor devices may include a control loop to control the voltage output of the charge pump to a desired value.

SUMMARY

According to various embodiments, a charge pump arrangement is provided, wherein the charge pump arrangement includes: a charge pump circuit configured to convert an input voltage into an output voltage based on a pump clock signal; a feedback path configured to provide a feedback signal representing the output voltage of the charge pump circuit; a control circuit configured to receive a clock signal and to control the output voltage of the charge pump circuit by controlling the pump clock signal based on the feedback signal and the clock signal.

BRIEF DESCRIPTION OF THE DRAWINGS

In the drawings, like reference characters generally refer to the same parts throughout the different views. The drawings are not necessarily to scale; emphasis instead generally being placed upon illustrating the principles of the invention. In the following description, various embodiments of the invention are described with reference to the following drawings, in which:

FIG. 5 shows a method for operating a charge pump arrangement in a schematic flow diagram, according to various embodiments; and FIG. 6 shows a method for operating a charge pump arrangement in a schematic flow diagram, according to various embodiments.

DESCRIPTION

Figure 1A:
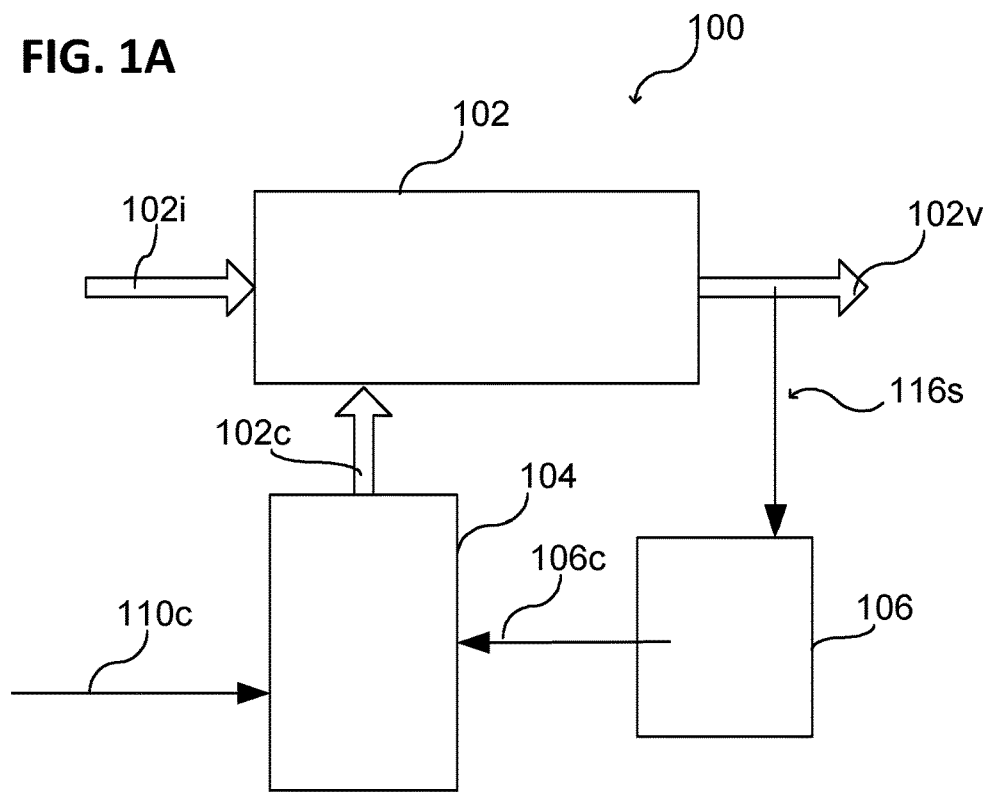
FIG. 1A shows a charge pump arrangement in a schematic view, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "coupled" is used herein to mean electrically connected, which may include a direct connection or an indirect connection, wherein an indirect connection may only include additional structures in the current path that not influence the substantial functioning of the described circuit or device. The term "electrically conductively connected" that is used herein to describe an electrical connection between two terminals, two contacts, etc. may be understood as an electrically conductive connection with ohmic behavior, e.g. provided by a metal or degenerate semiconductor in absence of p-n junctions in the current path.

Various embodiments are related to a high voltage discrete time control loop to control a charge pump. A charge pump may be also referred to herein as a charge pump circuit. Further, a voltage divider may be also referred to herein as voltage divider circuit. Further, a controller may be also referred to herein as control circuit. According to various embodiments, the circuits or electronic components referred to herein may be integrated into a single electronic device, e.g. into a chip, or may be provided by a plurality of electronic devices coupled with each other. The charge pump circuit, the control circuit, and/or the voltage divider circuit may be implemented via a single circuit structure or via a plurality of circuits coupled with each other. The term AC, as used herein, may refer to an alternating current and/or to an alternating voltage.

According to various embodiments, a charge pump arrangement may be integrated into a semiconductor work piece (e.g. into a wafer or into a chip) to provide a pre-defined voltage for any desired electronic circuit. The charge pump arrangement may be part of an electronic circuit or may be coupled to an electronic circuit. The charge pump of the charge pump arrangement may be supplied with an input voltage and with a pump clock signal, wherein an output voltage is generated and controlled based on the clock signal. According to various embodiments, the charge pump circuit of a charge pump arrangement may include a so called phase generator circuit and a charge pump pipe, wherein the phase generator circuit control the operation of the charge pump pipe based on the pump clock signal. The input voltage may be converted via the charge pump arrangement to an output voltage, wherein the output voltage may be different from (e.g. greater than) the input voltage.

In general, operation of a charge pump without a control loop may lead to an unpredictable DC-output or AC-output characteristic that may be a function of the charge pump process, the temperature, the load, and/or the supply voltage, and the like. This may cause a problem if the charge pump is used in an embedded design, since the output characteristic has to be for example constrained to fulfill system requirements in terms of performances and reliability. Therefore, a charge pump may be operated based on a control loop, e.g. based on a closed control loop. The control loop may be configured to provide a stable charge pump system to guarantee system specified DC/AC performances. However, adding a control loop to a charge pump may consume chip area and electric power. As a rule of thumb, every 1 μA of an output current generated by a charge pump may require an investment of $(n+1)*1.8$ μA of an input current from the charge pump supply source, wherein n is the number of charge pump stages. For example, a 17 stage charge pump may require an 65 μA input current ($I_{in}$) to generate a 2 μA output current ($I_{out}$). Therefore, it may be preferred to move as many blocks as possible of the system chain to the low voltage.

A charge pump pipe may be modelled by assuming a switching voltage source between $(n+1)*VDD$ (VDD may represent the input voltage) and a high Z (Z may represent the electrical impedance) with an output impedance depending from the pump design as well as of the load ($C_{load}$, $I_{load}$, $R_{load}$), wherein this forms a low pass filter with a pole at $P0_{on}$ and $P0_{off}$ depending from $R_{out} \| R_{load}$ and $C_{load}$.

A control component may be used to control the charge pump pipe, the control component may include a comparator (conventionally a continuous time based comparator may be used), wherein the transfer function of the comparator may be dominated by a pole. According to the power that is invested, this pole may enter in the band width of the system, in the majority of the cases may be a low voltage design to spare power (e.g. current from the charge pump). Further a voltage divider may be used, since the output pump voltage shall be compared with a low voltage reference to generate an error signal. A conventional voltage divider that is used to control a charge pump may consume electrical energy from the pump output. Further, a conventionally used voltage divider may have a very complex transfer function.

Various embodiments may be based on the finding, that the voltage divider may be a critical block with respect to an efficient and precise charge pump design, because it conventionally consumes DC current from the pump output. In general, to make this current consumption as small as possible, high-ohmic resistor dividers or big diode divider chains may be used. However, this may lead to multiple poles and zero in the transfer function, wherein some of these poles may be placed around the P0 of the pump chain creating potentially unstable systems. Because of its time discrete nature and poor DC amplification, such a system is seldom unstable, but will generate in most of the cases very high ripples and errors in the level changes and load changes. Further, with the new tech nodes implementing a high-ohmic resistance divider may cost more and more relative area and a diode divider may not be used because of lower performances. The conventional design of the charge pump systems may be a combination of discrete time blocks and continues time blocks, i.e. the pump chain may be a discrete time block, wherein the other blocks may conventionally be continuous time blocks. Therefore, conventional controlled charge pump systems may consume DC-current although being used only in some specific moments.

To compensate the drawbacks of a resistance based voltage divider, one or more tunable capacitances may be added, which may be an "art" and can be optimized only post layout for some specific resistance ratios and process corners, at the cost of extra area for compensation capacitances and a risk if the process extraction information are not accurate. This conventional concept could also create startup problems.

Another conventionally used concept may include to replace the resistance based voltage divider with a level shifter based on a resistance and a current DAC (digital to analog converter) sink. This concept may require a very precise current DAC with a high immunity to noise injected. Further, the concept may not avoid different DC current consumption for different settings, and it may be slow by design in changing level. Further, the design may be only optimized post layout.

According to various embodiments, a complete discrete time system may be used for operating a charge pump arrangement, e.g. for operating a charge pump and for operating the control loop that is configured to control the voltage output of the charge pump. Therefore, according to various embodiments, a DC current consumption can be avoided or reduced. According to various embodiments, the control chain that is provided to control the charge pump may be clocked (i.e. according to a system clock), e.g. with the pump input clock.

Various embodiments are based on the finding that the current consumption of a charge pump arrangement can be reduced by avoiding any DC current path in the control loop circuit of the charge pump arrangement, e.g. by using a capacitive divider or a switch-capacitive divider. According to various embodiments, a capacitive divider may include at least two capacitors coupled in a series connection. According to various embodiments, the switch-capacitive divider may include at least one tunable capacitance or, in other words, the switch-capacitive divider may be a tunable switch-capacitive divider. According to various embodiments, the capacitive divider or switch-capacitive divider may have an output that is connected to a control circuit, the control circuit including for example an offset compensated latch and/or a comparator. The capacitive divider has a flat transfer function over a large frequency range. If correctly designed, the parasitic have an influence of 5% error or less, e.g. less than 3% error, e.g. 2% error.

According to various embodiments, at least one high voltage capacitor and a corresponding switch and a plurality of low voltage capacitors and a corresponding switch may be used for tuning the capacitive divider. This may also allow a minimal area consumption of the circuit integrated in semiconductor technology.

According to various embodiments, the capacitive divider may be calibrated at any time, therefore, there may be no necessity of a post layout fine tuning. According to various embodiments, an offset compensation may be implemented as a DC biasing and refresh operation. The offset compensation may be performed only to compensate leakage effect on the capacitive divider and a threshold voltage (Vth) drift of the control circuit, e.g. of a latch and/or a comparator.

According to various embodiments, the charge pump arrangement described herein may allow at least one of the following: output ripples and load/voltage change errors may be minimal, a DC current consumption may be avoided, a high band width of the control loop may be provided, almost no current consumption in sleep mode and a scalable current vs. performances in the active mode may be achieved; and no resistances have to be integrated into the circuit.

FIG. 1A illustrates a charge pump arrangement 100 in a schematic view, according to various embodiments. The charge pump arrangement 100 may include a charge pump circuit 102 (also referred to as charge pump). The charge pump circuit 102 may be configured to convert an input voltage 102i into an output voltage 102v. The charge pump circuit 102 may be configured to convert the input voltage 102i into the output voltage 102v based on a pump clock signal 102c. The charge pump circuit 102 may be configured to provide a number (n, integer) of pump stages to convert the input voltage 102i into a higher output voltage 102v. According to various embodiments, any desired charge pump circuit 102 may be used, however, the charge pump circuit 102 may be operated clocked (i.e. according to a system clock), or, in other words, in a clocked operation mode.

According to various embodiments, the charge pump arrangement 100 may further include a control circuit 104. The control circuit 104 may be configured to control the output voltage 102v of the charge pump circuit 102. Illustratively, the charge pump circuit 102 is controlled in a closed-loop configuration via the control circuit 104. The control circuit 104 may be configured to control the output voltage 102v of the charge pump circuit 102 by controlling the pump clock signal 102c supplied to the charge pump circuit 102 based on a feedback signal 106c. According to various embodiments, the control circuit 104 may be configured to receive a clock signal 110c. Further, the control circuit 104 may be configured to control the output voltage 102v of the charge pump circuit 102, e.g. by controlling the pump clock signal 102c based on a feedback signal 106c. The control circuit 104 may be configured to control the output voltage 102v of the charge pump circuit 102 based on the clock signal 110c, or, in other words, the control circuit 104 is operated discontinuously or in other words discretely. In this case, the control circuit 104 is switched "on" and "off" based on the clock signal 110c. Therefore, the current consumption may be reduced. Illustratively, the control circuit 104 is switched on, i.e. is operating, synchronously with the charge pump circuit 102.

According to various embodiments, a feedback path 106 is used to provide the feedback signal 106c for the control circuit 104. The feedback signal 106c may represent the output voltage 102v of the charge pump circuit 102.

Figure 1B:
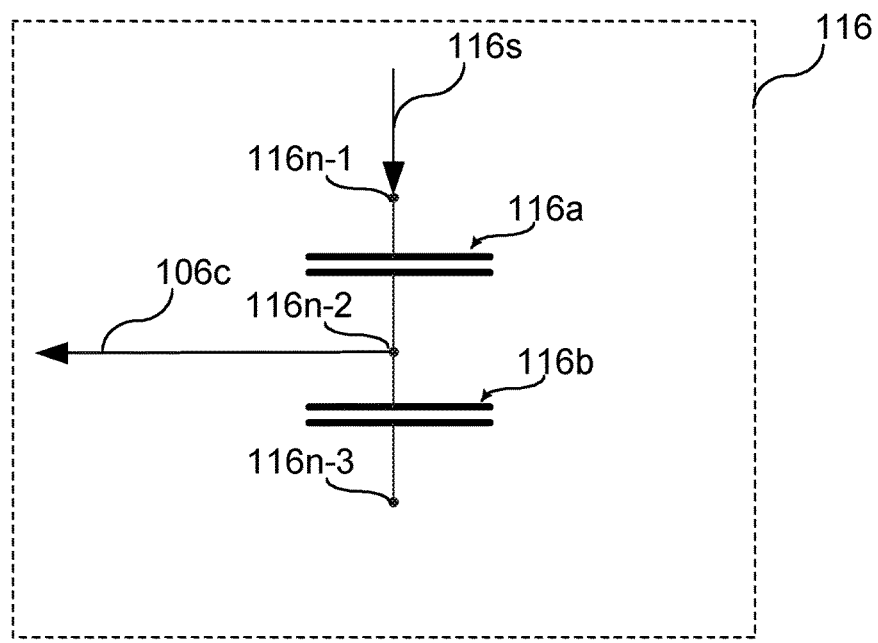
FIG. 1B shows a voltage divider of a charge pump arrangement including at least two capacitors in a schematic view, according to various embodiments.

According to various embodiments, a feedback path 106 may include at least one voltage divider circuit 116 (see FIG. 1B). The voltage divider circuit 116 may be configured to sense 116s the output voltage 102v and to provide the feedback signal 106c for the control circuit 104. Illustratively, the control circuit 104 may be configured to provide a so called error control for the charge pump circuit 102, wherein the high output voltage 102v of the charge pump circuit 102 is sensed via the voltage divider circuit 116. According to various embodiments, the voltage divider circuit 116 may be a capacitive divider, as for example described in the following. According to various embodiments, if the control circuit 104 is configured to receive a high voltage feedback signal the voltage divider circuit 116 may not be necessary.

FIG. 1B illustrates a voltage divider circuit 116 of the charge pump arrangement 100 in a schematic view, according to various embodiments. The voltage divider circuit 116 may include a first capacitor 116a and a second capacitor 116b coupled in a series arrangement, e.g. between a first node 116n-1 and a third node 116n-3. The feedback signal 106c may be tapped at a second node 116n-2 between the first capacitor 116a and the second capacitor 116b. The sensed output voltage 116s may be an input for the voltage divider circuit 116 at the first node 116n-1. The third node 116n-3 may be coupled to a reference potential, e.g. to ground or any other desired reference potential. The feedback signal 106c may be provided as an output of the voltage divider circuit 116 at the second node 116n-2.

It goes without saying that the first capacitor 116a and the second capacitor 116b may include respectively one or more capacitor structures to provide the functionality of the first and second capacitor 116a, 116b as desired. According to various embodiments, the second capacitor 116b may include or may be an adjustable capacitor.

According to various embodiments, the control circuit 104 may be configured to control (in other words to adapt, to modify and/or to generate) the pump clock signal 102c to control the charge pump circuit 102, i.e. to control the output voltage 102v of the charge pump circuit 102.

Figure 1C:
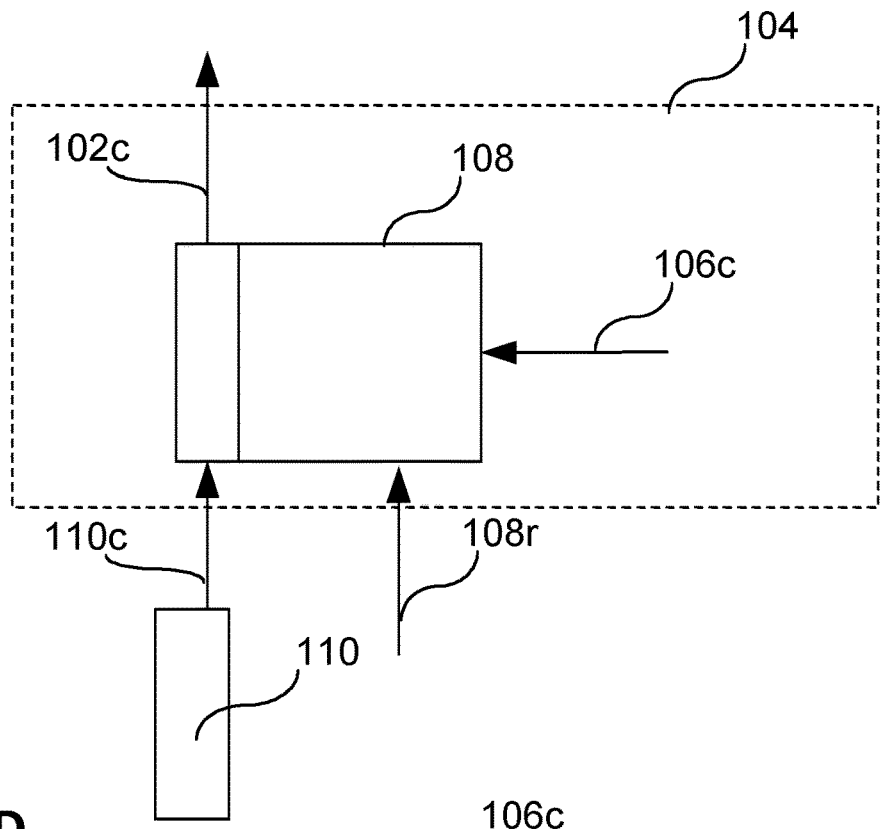
FIG. 1C shows control circuit of a charge pump arrangement in a schematic view, according to various embodiments.

FIG. 1C illustrates the control circuit 104 of the charge pump arrangement 100, according to various embodiments. The control circuit 104 may be configured to receive a clock signal 110c, e.g. from a clock signal generator circuit 110 or from any other source, and to control an output of the pump clock signal 102c to the charge pump circuit 102. According to various embodiments, the charge pump circuit 102 may include at least three terminals (see also FIG. 1A), an input terminal to input the input voltage 102i, an output terminal to output the output voltage 102v and a control terminal to input the pump clock signal 102c.

According to various embodiments, the control circuit 104 may be configured to compare the feedback signal 106*c* with a reference signal 108*r* or, in other words, the control circuit 104 may be configured to compare the voltage value of the feedback signal 106*c* with a voltage value of a reference signal 108*r*. The reference signal 108*r* represents a reference voltage (e.g. associated with the output voltage 102*v*), wherein the feedback signal 106*c* represents the output voltage 102*v* of the charge pump circuit 102 sensed by the voltage divider circuit 116. Based on a result of comparing the feedback signal 106*c* and the reference signal 108*r* with each other, the control circuit 104 may be configured to either to allow the output of the pump clock signal 102*c* to the charge pump circuit 102 or to suppress, modify and/or adjust the output of the pump clock signal 102*c* to the charge pump circuit 102. According to various embodiments, the reference signal 108*r* may be supplied to the control circuit 104 from any suitable external source or may be provided by the control circuit 104 itself.

According to various embodiments, the control circuit 104 may be configured to allow the output of the pump clock signal 102*c* in the case that the voltage output 102*v* represented by the feedback signal 106*c* is in a first voltage range defined by the reference signal 108*r*. Further, the control circuit 104 may be further configured to suppress, modify and/or adjust the output of the pump clock signal 102*c* in the case the voltage output 102*v* represented by the feedback signal 106*c* is in a second voltage range (different from the first voltage range) defined by the reference signal 108*r*.

According to various embodiments, the control circuit 104 may be configured to allow the output of the pump clock signal 102*c* in the case that the voltage output 102*v* represented by the feedback signal 106*c* is less than the reference voltage output represented by the reference signal 108*r*. Further, the control circuit 104 may be further configured to suppress, modify and/or adjust the output of the pump clock signal 102*c* in the case the voltage output 102*v* represented by the feedback signal 106*c* is greater than the reference voltage output represented by the reference signal 108*r*.

According to various embodiments, controlling the output of the pump clock signal 102*c* to the charge pump circuit 102 may include to suppress, modify and/or adjust the clock signal 110*c* to provide no output of the pump clock signal 102*c* or to provide an output of a modified and/or adjusted pump clock signal 102*c* to the charge pump circuit 102. According to various embodiments, the control circuit 104 may include a comparator (e.g. a comparator circuit) and/or a latch (e.g. a latch circuit) to compare the reference signal 108*r* with the feedback signal 106*c* and to control the output of the pump clock signal 102*c* to the charge pump circuit 102.

Figure 1D:
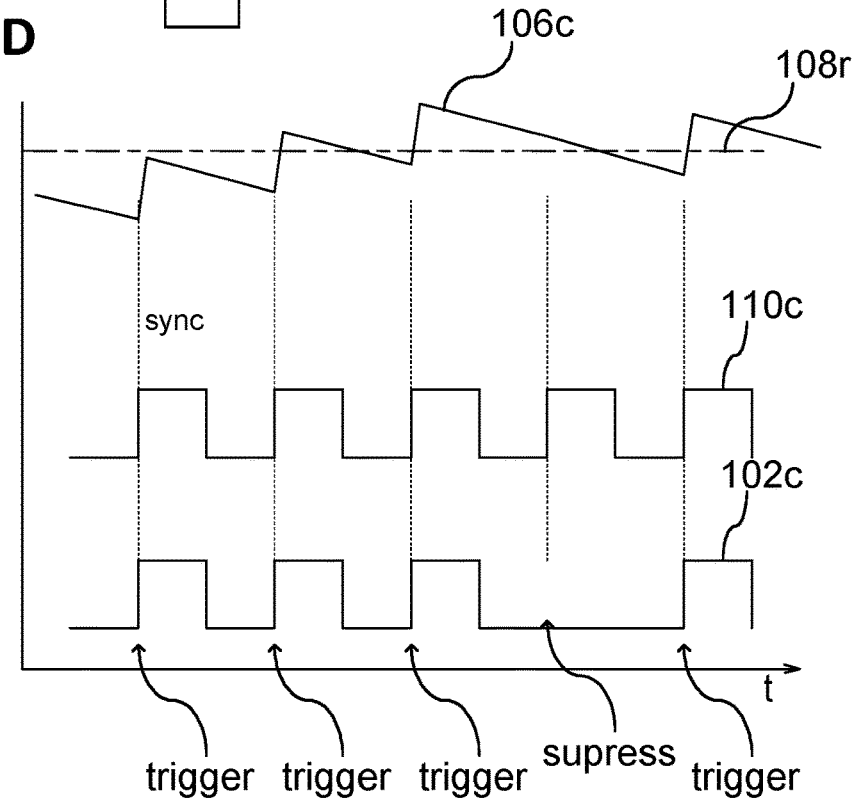
FIG. 1D shows a control of a clock signal provided for a charge pump circuit in a schematic view, according to various embodiments.

According to various embodiments, the control circuit 104 may be configured to suppress the pump clock signal 102*c* and/or to forward the pump clock signal 102*c* to the charge pump circuit 102 to control the voltage output 102*v* of the charge pump circuit 102, as illustrated in FIG. 1D in a schematic view. A reference voltage may be represented by the reference signal 108*r* defining the desired voltage output of the charge pump circuit 102, as described above.

In one case, the feedback signal 106*c* may have a lower voltage value than the reference signal 108*r*. In this case, the voltage output 102*v* of the charge pump circuit 102 is lower than the desired voltage output and the control circuit 104 is configured to trigger operation of the charge pump circuit 102 via the pump clock signal 102*c* to increase the voltage output 102*v* of the charge pump circuit 102. In this case, according to various embodiments, the clock signal 110*c*, e.g. generated by any suitable circuit (not illustrated), is forwarded by the control circuit 104 to the charge pump circuit 102 as the pump clock signal 102*c*.

Further, in the other case, the feedback signal 106*c* may have a greater voltage value than the reference signal 108*r*. In this case, the output voltage 102*v* of the charge pump circuit 102 is greater than the desired voltage output and the charge pump circuit 102 is not triggered via the pump clock signal 102*c*. In this case, the pump clock signal 102*c* is suppressed to not further increase the output voltage 102*v* of the charge pump circuit 102. In other words, in this case, according to various embodiments, the clock signal 110*c* generated for example by any suitable circuit (not illustrated) is not forwarded (also referred to as suppressed) by the control circuit 104 to the charge pump circuit 102. Based on this control loop, the charge pump circuit 102 may be controlled via the control circuit 104 as illustrated in FIG. 1D, according to various embodiments.

Further, as illustrated in FIG. 1D, the charge pump circuit 102 may be a synchronous system and may boost the output voltage 102*v* or leave the output voltage 102*v* floating every rising edge of the pump clock signal 102*c*, as illustrated in FIG. 1D. Alternatively, also the falling edge of the pump clock signal 102*c* can be used as well.

According to various embodiments, the charge pump arrangement 100 (e.g. the voltage divider 116 and/or the control circuit 104) may be operated in at least two different operation modes. Therefore, according to various embodiments, the charge pump arrangement 100 may further include a switch arrangement to connect the nodes of the voltage divider circuit 116 to reference potentials (e.g. to one or more reference terminals) respectively, as illustrated in the following with reference to FIGS. 2A to 2D.

Figure 2A:
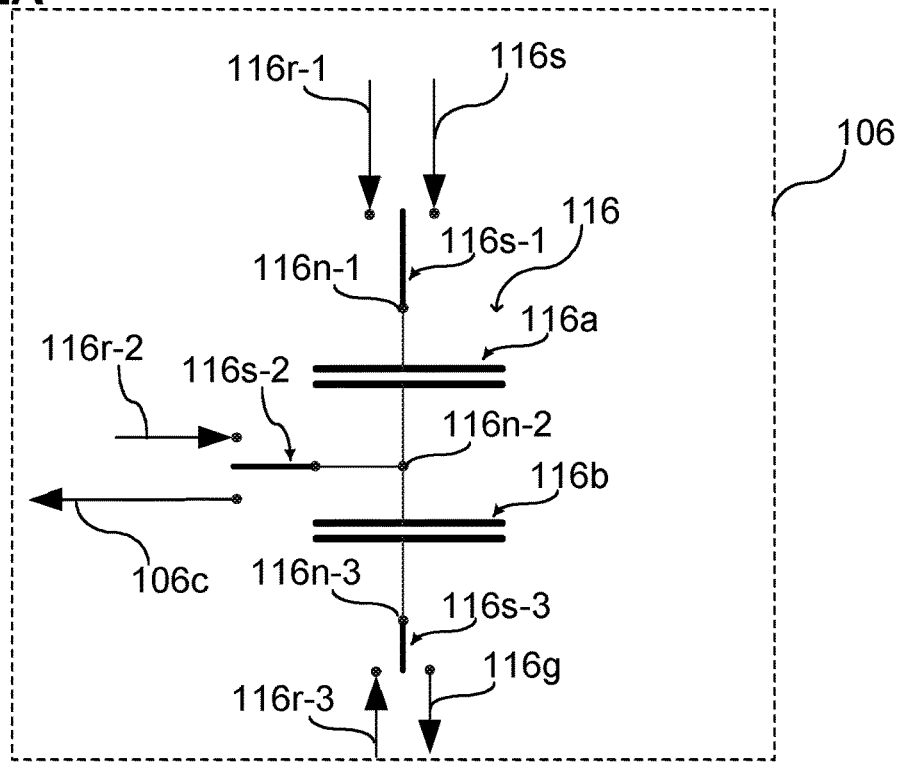
FIGS. 2A to 2D show a voltage divider circuit of a charge pump arrangement in two different operation modes.

FIG. 2A illustrates a voltage divider circuit 116 of a charge pump arrangement 100 in a schematic circuit diagram, according to various embodiments. The voltage divider circuit 116 is configured to be connected to a set of reference potentials 116*r*-1, 116*r*-2, 116*r*-3, e.g. via a switch arrangement. The switching arrangement may include a set of switches 116*s*-1, 116*s*-2, 116*s*-3. The reference potentials may be provided via a set of reference terminals or, in other words, via a set of reference nodes. According to various embodiments, the switching arrangement may be configured to alternatingly switch charge pump arrangement 100 (e.g. the control circuit and/or the voltage divider circuit 116) into a first operation mode 200*a* and into a second operation mode 200*b*. The two operation modes are different from each other, as described in more detail below. The switching arrangement may be controlled via any suitable controller, e.g. via a separated controller or via the control circuit 104. According to various embodiments, the operation of the switching arrangement, i.e. the switching of the operation modes 200*a*, 200*b*, may be controlled synchronized with the clock signal 110*c*. In other words, the control circuit 104 and the voltage divider circuit 116 may be operated clocked (i.e. according to a system clock).

Figure 2B:
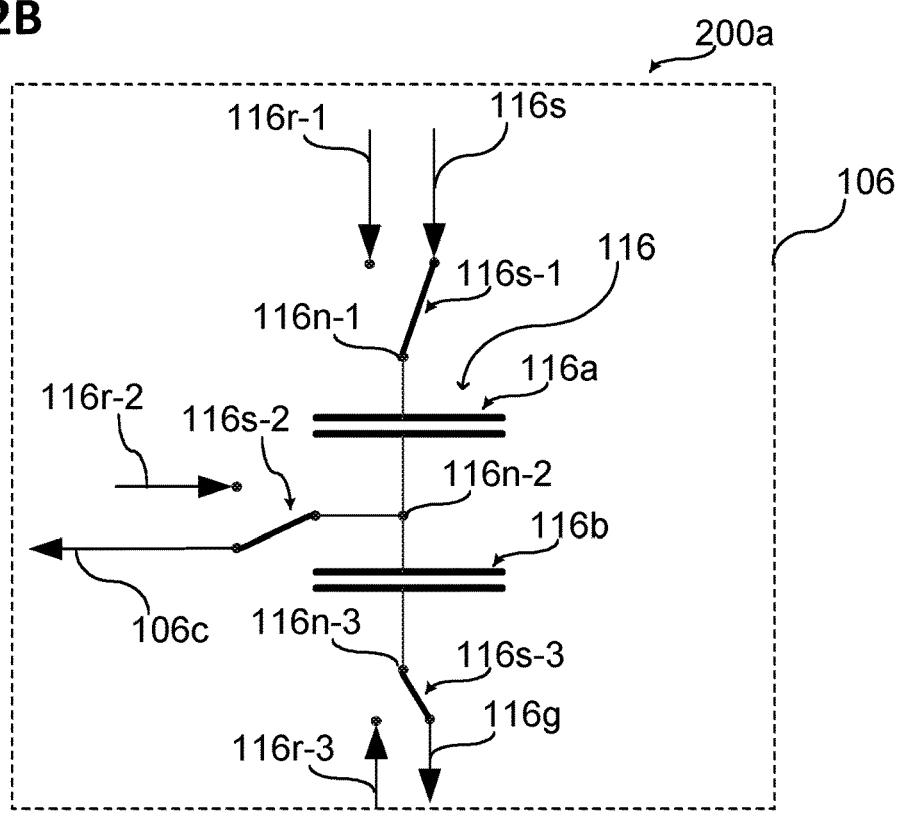

FIG. 2B illustrates a schematic circuit diagram of the voltage divider circuit 116 in the first operation mode 200*a*, according to various embodiments. In the first operation mode 200*a*, the voltage divider circuit 116 may be coupled to the output of the charge pump circuit 102 to sense the output voltage 102*v*, as described above. Further, the voltage divider circuit 116 may be coupled to the control circuit 104 to provide the feedback signal 106*c*, as described above. The third node 116*n*-3 of the voltage divider circuit 116 may be coupled for example to ground 116*g* or to any other suitable reference potential. Therefore, in the first operation mode 200a, the voltage divider circuit 116 and the control circuit 104 may be used to control the charge pump circuit 102 in a closed loop arrangement. Illustratively, the first operation mode is a control mode.

Figure 2C:
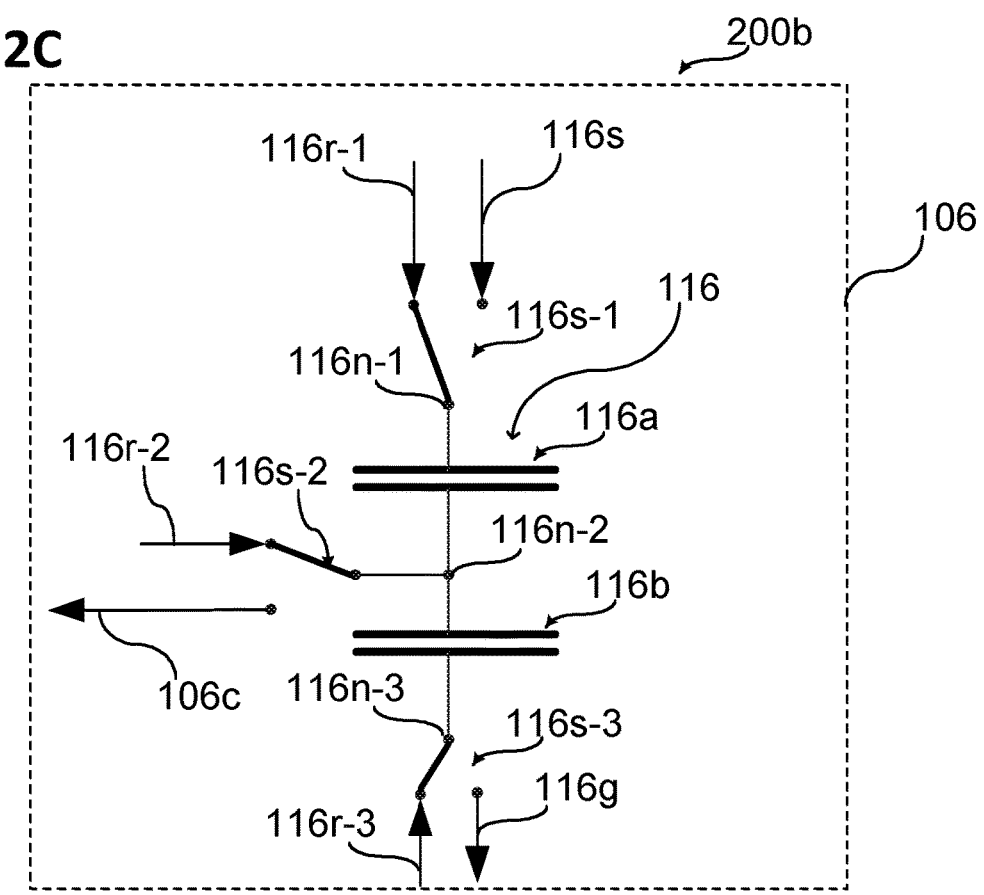

FIG. 2C illustrates a schematic circuit diagram of the voltage divider circuit 116 in the second operation mode 200b, according to various embodiments. In the second operation mode 200b, the first capacitor 116a and the second capacitor 116b of the voltage divider circuit 116 may be coupled to a set of reference potentials 116r-1, 116r-2, 116r-3 (e.g. via a set of reference terminals or reference nodes) to set the first capacitor 116a to a first predefined voltage and to set the second capacitor 116b to a second predefined voltage. As illustrated in FIG. 2C, the first node 116n-1 of the voltage divider circuit 116 is coupled to a first reference potential 116r-1 via a first switch 116s-1, the second node 116n-2 of the voltage divider circuit 116 is coupled to a second reference potential 116r-2 via a second switch 116s-2, and the third node 116n-3 of the voltage divider circuit 116 is coupled to a third reference potential 116r-3 via a third switch 116s-3. According to various embodiments, the function of the second switch 116s-2 may be also provided by (e.g. integrated into) the control circuit 104, as for example illustrated in FIG. 3A. Illustratively, the second operation mode 200b is not a control mode, since the voltage divider circuit 116 is not coupled to the voltage output 102v of the charge pump circuit 102 and, therefore, does not sense the voltage output 102v. According to various embodiments, the first operation mode 200a may be a hold phase (or in other words a control operation phase) and the second operation mode 200b may be a sample phase (or, in other words, a refresh phase or update phase). According to various embodiments, since the charge pump circuit 102 may be operated in accordance to a clock signal, the sample phase can be performed between two successive clocks without disturbing the operation of the control loop.

Figure 2D:
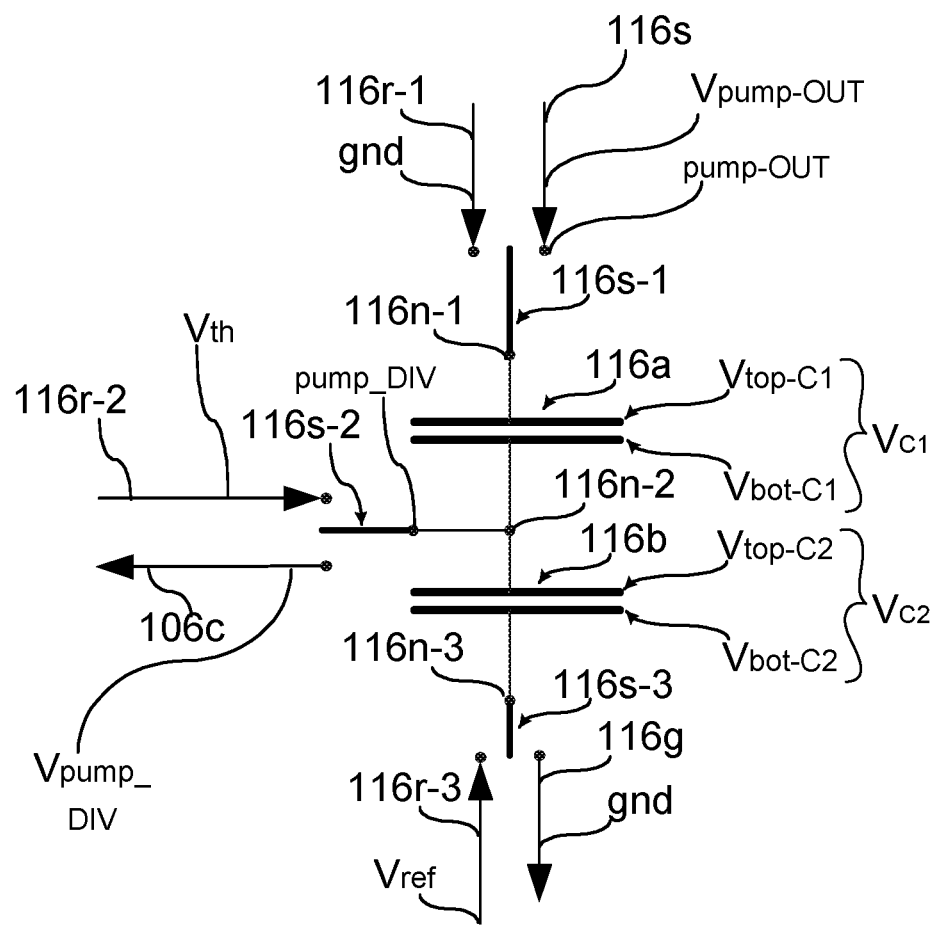

FIG. 2D illustrates the voltage divider circuit 116 of the charge pump arrangement 100 in a more detailed schematic circuit diagram, according to various embodiments. The first reference potential 116r-1 may be a ground potential, gnd, or any other suitable first reference potential. The second reference potential 116r-2 may be a threshold potential, $V_{th}$, of the control circuit 104 (e.g. of a latch/comparator circuit of the control circuit 104) or any other suitable second reference potential. The third reference potential may be a reference potential, $V_{ref}$. The respective potential difference to ground or to a common potential may define the corresponding voltages.

Between first operation mode 200a and the second operation mode 200b the voltage change over the capacitances can be written as:

$$\begin{cases} \Delta V_{c2} = V_{c2+}^{\square} - V_{c2-}^{\square} = V_{topc2+} - V_{topc2-} - (V_{botc2+} - V_{botc2-}); \\ \Delta V_{c1} = V_{c1+}^{\square} - V_{c1-}^{\square} = V_{topc1+} - V_{topc1-} - (V_{botc1+} - V_{botc1-}). \end{cases}$$

Replacing the Symbols with the node voltages leads to:

$$\begin{cases} \Delta V_{c2} = V_{pump\_div}^{\square} - V_{th}^{\square} + V_{ref}^{\square}; \\ \Delta V_{c1} = V_{pump_{out}} - V_{pump\_div}^{\square} + V_{th}^{\square}; \\ C_2 \cdot \Delta V_{c2} = \Delta Q_{c2} = C_2 \cdot (V_{pump\_div}^{\square} - V_{th}^{\square} + V_{ref}^{\square}) = \Delta Q_{c1} = \\ C_1 \cdot \Delta V_{c1} = C_1 \cdot (V_{pump_{out}} - V_{pump\_div}^{\square} - V_{th}^{\square}); \end{cases}$$

and $$V_{pump\_div}^{\square} = V_{th}^{\square} + V_{pump_{out}} \cdot \frac{C_1}{C_1 + C_2} - V_{ref} \cdot \frac{C_2}{C_1 + C_2}.$$

By connecting the C1 to gnd, C2 to Vref, and pump_div (e.g. the second node 116n-2) to Vth (in the second operation mode 200b) and after connecting the C1 to pump_out, C2 to gnd, and pump_div left floating (in the first operation mode 200a) the following voltage is generated on the pump_div line:

$$Vpump_{div} = Vth + \frac{C_1}{C_1 + C_2} * Vpump_{div} - \frac{C_2}{C_1 + C_2} * Vref.$$

Providing for an example that the $C_1$=10 pF, $C_2$=1 pF, $V_{ref}$=500 mV, and $V_{th}$=700 mV than:

$Vpump_{div}$=700 mV+$^{10}/_{11}$*$Vpump_{out}$−$^1/_{11}$*500 mV.

In this case, only when pump_out will be 10 times as high as Vref the control circuit 104 (e.g. the latch/comparator) will toggle, disregarding this threshold and offset.

As an additional example, if $V_{ref}$=$V_{th}$ than:

$$Vpump_{div} = \frac{C_1}{C_1 + C_2} * Vpump_{out} + \frac{C_1}{C_1 + C_2} * Vref..$$

In this case, the control circuit 104 (e.g. the latch/comparator) will toggle when:

$$Vpump_{out} = \frac{C_2}{C_1} * Vref.$$

But the dynamic gain of the cap divider in first operation mode 200a will be:

$$\frac{dVpump_{out}}{dVpump_{div}} = \frac{C_1 + C_2}{C_1}.$$

According to various embodiments, the sensitivity of the capacitive divider in first operation mode 200a may be lower than the one provided by a conventionally used resistance divider thereby increasing the precision.

According to various embodiments, the second operation mode 200b may be activated every time the DC voltage on the pump_div node 116n-2 is drifting because of charge injection and leakage and/or every time the threshold of the control circuit 104 (e.g. of the latch/comparator) is drifting. The first operation mode 200a may be maintained as long as the previously mentioned reasons do not require a second operation mode 200b (illustratively a refresh or update of the voltage dividers capacitors 116a, 116b). In the first operation mode 200a, the current consumption of the capacitive divider 116 may be in average zero, if it us assumed that the pump_out voltage do not change its DC level (as it is usually the case). Further, the current consumption of the control circuit 104 (e.g. of the latch/comparator) may be implementation dependent.

Figure 3A:
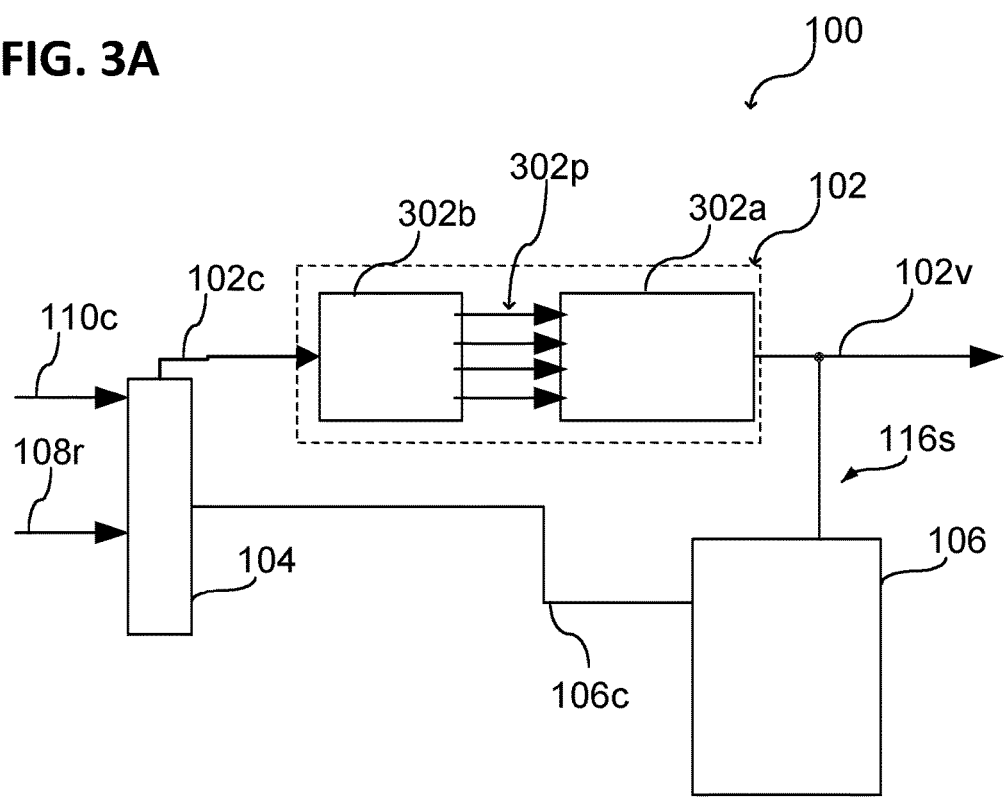
FIGS. 3A and 3B show a charge pump arrangement in a schematic view, according to various embodiments.

FIG. 3A illustrates a charge pump arrangement 100 in a schematic view, according to various embodiments. The charge pump circuit 102 of the charge pump arrangement 100 may include a pump chain circuit 302a and phase generator circuit 302b. The charge pump circuit 102 may be operated based on two or four phases 302p. The control circuit 104 may include a latch and/or a comparator circuit. The control circuit 104 may be configured to provide the pump clock signal 102c to the phase generator 302b of the charge pump circuit 102.

According to various embodiments, the control circuit 104 may be configured to compare the reference signal 108r with the feedback signal 106c. Further, the control circuit 104 may be configured to control the output of the pump clock signal 102c to the charge pump circuit 102, e.g. to the phase generator circuit 302b of the charge pump circuit 102, as described herein. If a single voltage divider circuit 116 is used in the charge pump arrangement 100, this may be performed only in the first operation mode.

According to various embodiments, the reference potential $V_{ref}$ provided at the third node 116n-3 of the voltage divider circuit 116 in the second operation mode 200b (see FIG. 2C) may be the same as provide with the reference signal 108r to the control circuit 104 to allow a desired comparison between the feedback signal 106c and the reference signal 108r in the first operation mode 200a. However, a threshold voltage, $V_{th}$, of the control circuit 104 may be used as the reference potential.

According to various embodiments, the control circuit 104 (e.g. the latch circuit and/or comparator circuit) may be updated on the low level of the clock signal 110c and to propagate out the result on the high level of the clock signal 110c, the control circuit 104 (e.g. the latch circuit and/or comparator circuit) may output the pump clock signal 102c that is used by the phase generator circuit 302b for operation of the charge pump circuit 102. In this case, the output, e.g. the pump clock signal 102c controlled by the control circuit 104, has to be 0 in the update phase (referred to as the second operation mode 200b) and either zero or one in the propagate phase (referred to as the first operation mode 200a) depending from the control circuit 104 comparison results (see FIG. 1D).

The input signal of the control circuit 104 may be, in the sample phase (referred to as the second operation mode 200b), equal to the threshold voltage, $V_{th}$, of the control circuit 104 (e.g. of the latch circuit) or equal to a reference voltage, $V_{ref}$, and, in the hold phase (referred to as the first operation mode 200a) the result of the switch cap capacitor divider 116.

According to various embodiments, the capacitor divider may include at least two capacitors 116a, 116b (C1, C2), coupled in series, and a floating node 116n-2 (referred to as pump_div), wherein the capacitors 116a, 116b are connected to two pass gates each (also referred to as switches), one of this pass gate may connect the capacitance plate to ground, gnd, the other to a voltage source, respectively a reference voltage, Vref, or the output pump voltage, pump_out (see FIG. 2D).

The control circuit 104 may be or may include a latch block that receives the clock signal 110c, the pump_div signal 106c and eventually a reference voltage 108r, and generating as output the pump clock signal 102c.

Further, the control circuit 104 may be configured to receive a sample signal 318s. Based on the sample signal 318s, the reference voltage or the threshold voltage may be forced to the second node 116n-2 of the capacitor divider 116. According to various embodiments, the control circuit 104 may be configured to be switched into a sample mode during the sample phase, wherein the reference voltage or the threshold voltage may be forced to the second node 116n-2 of the capacitor divider 116 (see FIG. 3B). The sample signal 318s may be synchronized according to the clock signal 110c. According to various embodiments, the reference voltage or a threshold voltage may be provided to the voltage divider circuit 116 to provide a reference potential or another potential at the second node 116n-2 of the voltage divider circuit 116 in the second operation mode 200b, as described before.

Figure 3B:
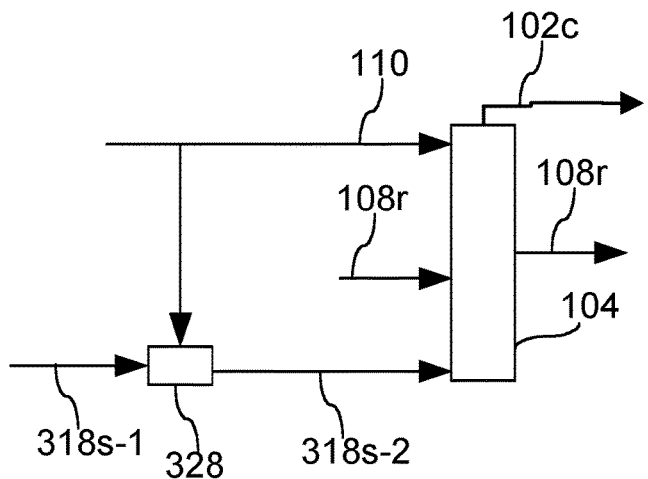
Figure 3C:
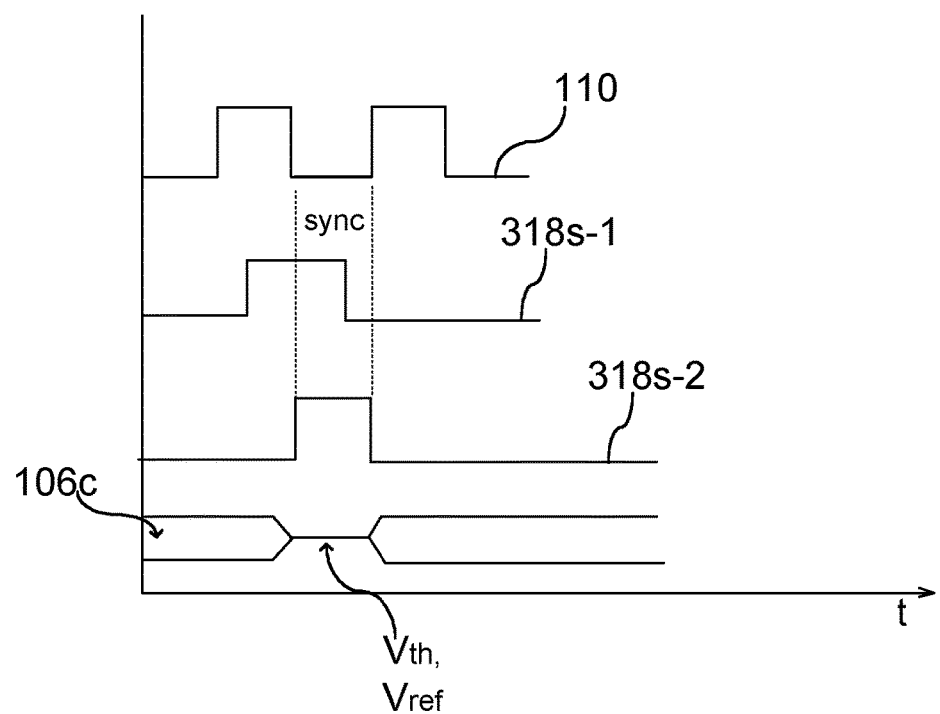
FIG. 3C shows a control of a sample signal provided for a voltage divider circuit of a charge pump arrangement in a schematic view, according to various embodiments.

According to various embodiments, the sample signal 318s is used to update the voltage divider circuit 116 and may be synchronized with the clock signal 110c and/or the pump clock signal 102c, as illustrated in FIG. 3B and FIG. 3C in a schematic view, according to various embodiments. If the sample signal is for example 1, a reference voltage 108r (or a buffered reference voltage 108r, i.e. the threshold voltage of the control circuit 104) may be forced on the pump_div and force the pump clock signal 102c to for example 0, and, if the sample signal is for example 0, the pump clock signal 102c is the virtual and operation of the clock signal and the latch/comparator comparison operation result, as illustrated in FIG. 1D. As illustrated in FIG. 3B, a synchronizer circuit 328 may be used to synchronize an input sample signal 318s-1 via the clock signal 110c to a synchronized sample signal 318s-2, as shown in FIG. 3C.

According to various embodiments, the second capacitor 116b of the voltage divider circuit 116 may be a controllable capacitor to set a desired capacitance.

During the second operation mode 200b, as described herein, the voltage divider circuit 116 may be not able to sense the output voltage 102v of the charge pump circuit 102 and, therefore, the charge pump circuit 102 may not be controlled via the control circuit 104 during the second operation mode 200b. If the time scale for the second operation mode 200b is selected to be very short, e.g. less than the frequency of the clock signal 110c, the update of the voltage divider circuit 116 may be achieved between two successive falling or rising edges of the clock signal 110c which may allow a high performance control of the charge pump circuit 102. However, a small time scale may result in other technical limitations. According to various embodiments, during the second operation mode 200b, as described herein, the voltage divider circuit 116 may be not able to sense the output voltage 102v of the charge pump circuit 102 and, therefore, the output of the pump clock signal 102c may be suppressed during the second operation mode 200b.

According to various embodiments, the control circuit 104 may be configured to perform at least two different actions, a detection action and a control action. The detection action may include, for example, comparing the feedback signal 106c with the reference signal 108r, or the like. The control action may include, for example, output the pump clock signal 102c based on the comparison. According to various embodiments, the two different actions may be performed simultaneously, e.g. on the same edge of the clock signal 110c. Alternatively, the two different actions may be performed with a predefined phase shift, e.g. with a half clock cycle phase shift or any other phase shift. However, the two different actions may be synchronized with the clock signal 110c.

According to various embodiments, at least two voltage divider circuits 116 may be used alternatingly to control the charge pump circuit 102, wherein respectively one of the two voltage divider circuits 116 is always in the first operation mode 200a so that the other one can be updated in the second operation mode 200b as long as necessary without losing precision in controlling the charge pump circuit 102.

Figure 4:
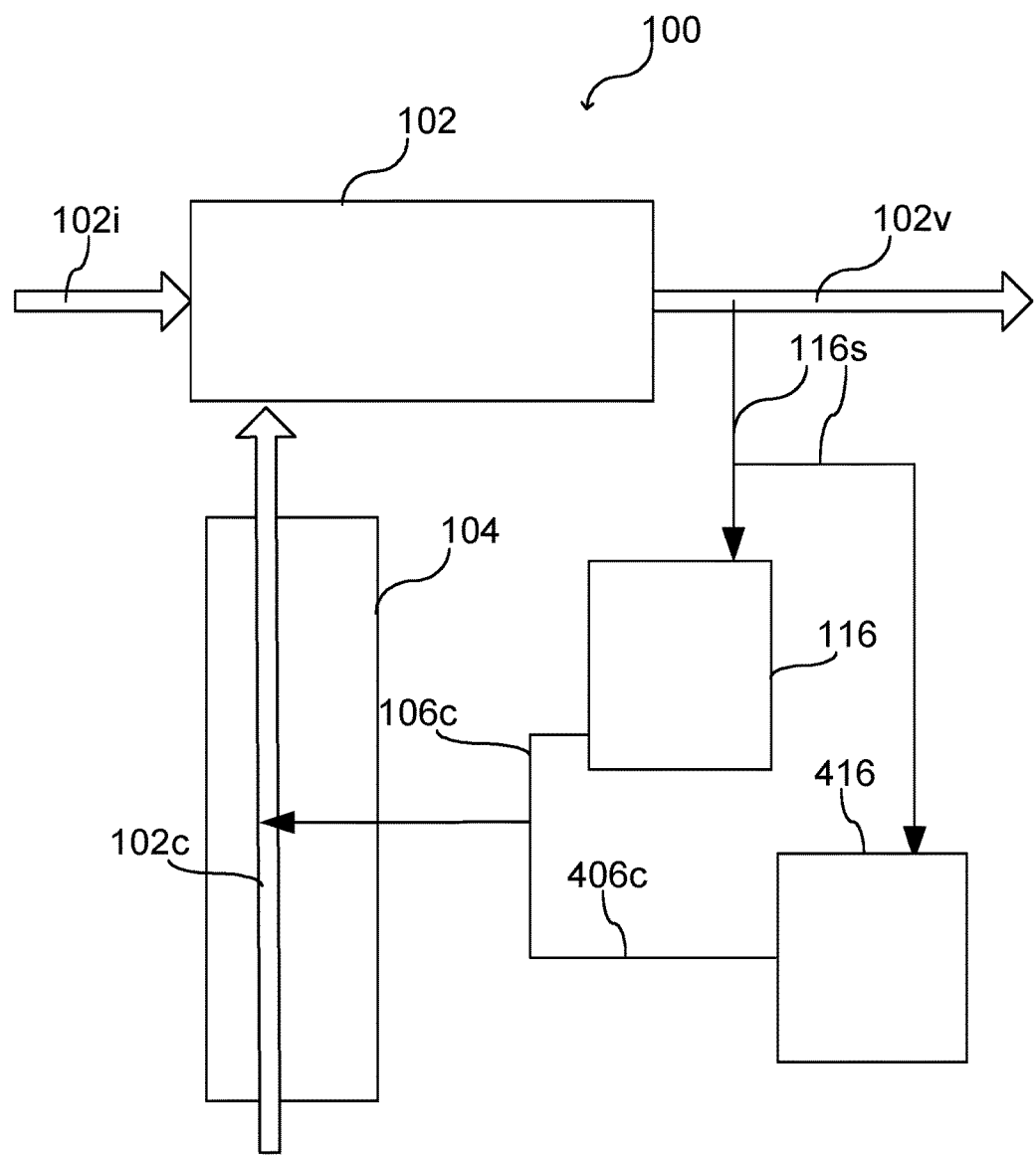
FIG. 4 shows a charge pump arrangement in a schematic view, according to various embodiments.

FIG. 4 illustrates a charge pump arrangement 100 including a charge pump circuit 102 and a control circuit 104 in a similar way as described above. Further, the charge pump arrangement 100 may include a first voltage divider circuit 116 (also referred to as voltage divider circuit 116) and a second voltage divider circuit 416 (also referred to as additional voltage divider). Both voltage dividers 116, 416 may be configured as described above, e.g. with reference to FIG. 1B. According to various embodiments, the first voltage divider circuit 116 may be configured to sense the output voltage 102v of the charge pump circuit 102 and to provide a first feedback signal 106c for the control circuit 104. Further, the second voltage divider circuit 416 may be configured to sense the output voltage 102v of the charge pump circuit 102 and to provide a second feedback signal 406c for the control circuit 104. The first voltage divider circuit 116 may include a first capacitor 116a and a second capacitor 116b coupled in a series arrangement, wherein the first feedback signal is tapped (at a node 116n-2) between the first capacitor 116a and the second capacitor 116b, as described above. The second voltage divider circuit 416 may include a third capacitor 116a and a fourth capacitor 116b coupled in a series arrangement, wherein the second feedback signal 406c is tapped (at a node 116n-2) between the third capacitor 116a and the fourth capacitor 116b, as described above. Illustratively, according to various embodiments, two of the voltage divider circuits 116 described above may be coupled in parallel to each other to alternatingly provide the feedback signal 106c for the control circuit 104.

According to various embodiments, the charge pump arrangement 100 may further include a switch arrangement (similar to the switch arrangement described above) that is configured to switch the charge pump arrangement 100 (e.g. the control circuit 104 and both voltage divider circuits 116, 416) into a first operation mode and into a second operation mode. According to various embodiments, in the first operation mode of the charge pump arrangement 100, the first voltage divider circuit 116 may be in the hold phase and the second voltage divider circuit 416 may be in the update phase, as described before, and, in the second operation mode of the charge pump arrangement 100, the first voltage divider circuit 116 may be in the update phase and the second voltage divider circuit 416 may be in the hold phase. In other words, in the first operation mode, the first voltage divider circuit 116 may be configured to sense the output voltage 102v of the charge pump circuit 102 and to provide the first feedback signal 106c; wherein, in the first operation mode, further the third capacitor and the fourth capacitor of the second voltage divider circuit 416 are coupled to a set of reference potentials to set the third capacitor to a third predefined voltage and to set the fourth capacitor to a fourth predefined voltage. Illustratively, in the first operation mode, the first voltage divider circuit 116 is used to control the charge pump circuit 102 and the second voltage divider circuit 416 is updated, similar to the operation of the single voltage divider circuit 116 describe above.

According to various embodiments, in the second operation mode, the second voltage divider circuit 416 is configured to sense the output voltage 102v of the charge pump circuit 102 and to provide the second feedback signal 406c; wherein, in the second operation mode, further the first capacitor and the second capacitor of the first voltage divider circuit 116 are coupled to a set of reference potentials to set the first capacitor to a first predefined voltage and to set the second capacitor to a second predefined voltage. Illustratively, in the second operation mode, the second voltage divider circuit 416 is used to control the charge pump circuit 102 and the first voltage divider circuit 116 is updated, similar to the operation of the single voltage divider circuit 116 describe above.

FIG. 5 illustrates a method 500 for operating a charge pump arrangement 100, according to various embodiments. The charge pump arrangement 100 may be configured as described above referring for example to FIGS. 1A to 3C or in a similar way. According to various embodiments, the method 500 for operating the charge pump arrangement 100 may include: in 510, alternating a first operation mode 200a and a second operation mode 200b of the charge pump arrangement 100 (e.g. of a control circuit and/or of a voltage divider circuit of the charge pump arrangement) to control a output voltage 102v of a charge pump circuit 102; in 520, sensing the output voltage 102v of a charge pump circuit 102 via a voltage divider circuit 116, the voltage divider circuit 116 including a first capacitor 116a and a second capacitor 116b coupled in a series arrangement; in 530, providing a feedback signal 106c via the voltage divider circuit 116 in the first operation mode 200a, the feedback signal 106c representing the output voltage 102v of the charge pump circuit 102 to control the output voltage 102v of the charge pump circuit 102 based on the feedback signal 106c; and, in 540, setting (e.g. charging or discharging) the first capacitor 116a to a first predefined voltage and setting (e.g. charging or discharging) the second capacitor 116b to a second predefined voltage in the second operation mode 200b. According to various embodiments, the predefined voltages of the capacitors 116a, 116b of the voltage divider circuit 116 may define the voltage dividing ratio and the feedback signal output of the voltage divider circuit 116.

According to various embodiments, a clock signal 110c may be provided with a pre-defined clock frequency to operate the charge pump circuit 102, as for example illustrated in FIG. 1D. Further, a pump clock signal 102c may be provided (e.g. generated or controlled) via the control circuit 104 based on the feedback signal 106c. The pump clock signal 102c may be provided to the charge pump circuit 102 in the case that the output voltage 102v represented by the feedback signal 106c is in a predefined first voltage range defined by a reference voltage 108r (e.g. less than the reference voltage 108r). According to various embodiments, the pump clock signal 102c may be suppressed in the case that the output voltage 102v represented by the feedback signal 106c is in a predefined second voltage range defined by a reference voltage 108r (e.g. greater than the reference voltage 108r). The output voltage 102v represented by the feedback signal 106c may be compared with the reference voltage represented by a reference signal via a comparator and/or controlling the clock signal via a latch.

FIG. 6 illustrates a method 600 for operating a charge pump arrangement 100, according to various embodiments. The charge pump arrangement 100 may be configured as described above for example with reference to FIG. 4 or in a similar way. According to various embodiments, the method 600 for operating a charge pump arrangement 100 may include: in 610, alternating a first operation mode and a second operation mode of the charge pump arrangement 100 (e.g. of a control circuit and/or of a voltage divider circuit of the charge pump arrangement) to control a output voltage 102v of a charge pump circuit 102; in 620, sensing the output voltage 102v of the charge pump circuit 102 via a first voltage divider circuit 116 and via a second voltage divider circuit 416, the first voltage divider circuit 116 including at least two first capacitors 116a, 116b coupled in a series arrangement and the second voltage divider circuit 416 including at least two second capacitors 116a, 116b coupled in a series arrangement, in 630, providing a first feedback signal 106c via the first voltage divider circuit 116 in the first operation mode, the first feedback signal 106c representing the output voltage 102v of the charge pump circuit 102 to control the output voltage 102v based on the first feedback signal 106c; in 640, setting (e.g. charging or discharging) the at least two second capacitors of the second voltage divider circuit 416 to predefined voltages in the first operation mode; in 650, providing a second feedback signal 406c via the second voltage divider circuit 416 in the second operation mode, the second feedback signal 406c representing the output voltage 102v of the charge pump circuit 102 to control the output voltage 102v based on the second feedback signal 406c; and in 660, setting (e.g. charging or discharging) the at least two first capacitors of the first voltage divider circuit 116 to predefined voltages in the second operation mode.

According to various embodiments, setting the at least two first capacitors and the at least two second capacitors to predefined voltages may include connecting the capacitors to a set of reference potentials (e.g. provided via reference potential terminals or reference potentials nodes) respectively. According to various embodiments, the change between the two operation modes may be provided by switching a suitably arranged switching arrangement. According to various embodiments, the output voltage 102v of the charge pump circuit 102 may be controlled in the first operation mode via the first feedback signal 106c and in the second operation mode via the second feedback signal 406c, as illustrated in FIG. 4, wherein a pump clock signal 102c is provided to the charge pump circuit 102 in dependence of a comparison of the output voltage 102v represented by the first feedback signal 106c and the second feedback signal 406c respectively with a reference voltage. According to various embodiments, the pump clock signal 102c may be controlled via a latch and/or a comparator.

According to various embodiments, the control loop based on the control circuit 104 and at least one voltage divider circuit 116, 416 may be completely digital to avoid any DC current consumption by the voltage divider circuit 116. However, only the switching current consumption for alternating the operation modes may remain.

According to various embodiments, the current consumption may be reduced virtually to zero from the high voltage path, the capacitor divider can perform the sampling operation so sporadically that the average current consumption goes almost to zero (e.g. in the range of about 100 nA or less). According to various embodiments, a switch cap concept may be used to scale down the voltage to avoid any need for resistors and to obtain an ideal transfer function over the frequency from the voltage divider. According to various embodiments, a clocked latch may be used to generate the phase generator clock (also referred to as the pump clock signal). Alternatively, a continuous time comparator can be used if of any advantage.

Example 1 is a charge pump arrangement 100, including: a charge pump circuit 102 configured to convert an input voltage 102i into an output voltage 102v based on a pump clock signal 102c; a feedback path 116 configured to provide a feedback signal 106c representing the output voltage 102v of the charge pump circuit 102; and a control circuit 104 configured to receive a clock signal 110c and to control the output voltage 102v of the charge pump circuit 102 by controlling the pump clock signal 102c based on the feedback signal 106c and the clock signal 110c.

In Example 2 the charge pump arrangement of Example 1 may optionally include that the control circuit 104 is configured to operate discontinuously according to the clock signal 110c.

In Example 3 the charge pump arrangement of Example 1 or 2 may optionally include that the control circuit 104 is configured to compare the output voltage 102v represented by the feedback signal 106c with a reference voltage; and, based on a result, either to allow the output of the pump clock signal 102c to the charge pump circuit 102, or to suppress the output of the pump clock signal 102c to the charge pump circuit 102. The reference voltage that may be compared with the respective feedback signal may or may not have the value of the output voltage. The reference voltage may be a scaled version of the desired output voltage. Further, the reference voltage may be a digital representation as long the control circuit perform an analog-to-digital conversion of the feedback signal or/and digital-to-analog conversion of the reference voltage.

In Example 4 the charge pump arrangement of Example 3 may optionally include that the control circuit 104 is configured to allow the output of the pump clock signal 102c in the case that the output voltage 102v represented by the feedback signal 106c is in a first predefined voltage range.

In Example 5 the charge pump arrangement of Example 4 may optionally include that the control circuit 104 is further configured to suppress the output of the pump clock signal 102c in the case the output voltage 102v represented by the feedback signal 106c is in a second predefined voltage range different from the first predefined voltage range.

According to various embodiments, the control circuit 104 may include at least one of a comparator circuit or a latch circuit to control the output of the pump clock signal 102c to the charge pump circuit 102.

In Example 6 the charge pump arrangement of any one of Examples 1 to 5 may optionally include that the control circuit 104 is configured to perform a detection action and a control action, wherein the detection action and a control action may be synchronized with the clock signal and performed with a predefined phase shift relative to each other.

In Example 7 the charge pump arrangement of any one of Examples 3 to 6 may optionally include that the feedback path includes a voltage divider circuit 116, wherein the voltage divider circuit 116 is coupled to the charge pump circuit 102 to sense the output voltage 102v and further coupled to the control circuit 104 to provide the feedback signal 106c.

In Example 8 the charge pump arrangement of Example 7 may optionally include that the voltage divider circuit 116 includes a first capacitor 116a and a second capacitor 116b coupled in a series arrangement, wherein the feedback signal 106c is tapped between the first capacitor 116a and the second capacitor 116b.

In Example 9 the charge pump arrangement of Example 7 or 8 may optionally further include: a switch arrangement configured to alternatingly switch the charge pump arrangement 100 into a first operation mode 200a and into a second operation mode 200b.

In Example 10 the charge pump arrangement of Example 9 may optionally include that in the first operation mode 200a, the voltage divider circuit 116 is configured to sense the output voltage 102v of the charge pump circuit 102 and to provide the feedback signal 106c. Example 10 may further include that in the second operation mode 200b, the first capacitor 116a and the second capacitor 116b of the voltage divider circuit 116 are coupled to a set of reference potentials to set the first capacitor 116a to a first predefined voltage and to set the second capacitor 116b to a second predefined voltage.

In Example 11 the charge pump arrangement of Example 8 may optionally further include: an additional voltage divider circuit 416 to sense the output voltage 102v of the charge pump circuit 102 and to provide an additional feedback signal 406c for the control circuit 104. Example 11 may further include that the additional voltage divider circuit 416 includes a third capacitor and a fourth capacitor coupled in a series arrangement, wherein the additional feedback signal 406c is tapped between the third capacitor and the fourth capacitor.

In Example 12 the charge pump arrangement of Example 11 may optionally further include: a switch arrangement configured to switch the charge pump arrangement 100 into a first operation mode and into a second operation mode.

In Example 13 the charge pump arrangement of Example 12 may optionally include that in the first operation mode, the first voltage divider circuit 116 is configured to sense the output voltage 102v of the charge pump circuit 102 and to provide the first feedback signal 106c to the control circuit 104. Example 13 may further include that in the first operation mode, the third capacitor and the fourth capacitor of the second voltage divider circuit 416 are coupled to a set of reference potentials to set the third capacitor to a third predefined voltage and to set the fourth capacitor to a fourth predefined voltage. Example 13 may further include that in the second operation mode, the second voltage divider circuit 416 is configured to sense the output voltage 102v of the charge pump circuit 102 and to provide the second feedback signal 406c to the control circuit 104. Example 13 may further include that in the second operation mode, the first capacitor and the second capacitor of the first voltage divider circuit 116 are coupled to a set of reference potentials to set the first capacitor to a first predefined voltage and to set the second capacitor to a second predefined voltage.

Example 14 is a method for operating a charge pump arrangement, the method including: alternating a first operation mode and a second operation mode of a charge pump arrangement to control a voltage output of a charge pump circuit; sensing the voltage output of a charge pump circuit via a voltage divider circuit, the voltage divider circuit including a first capacitor and a second capacitor coupled in a series arrangement, providing a feedback signal via the voltage divider circuit in the first operation mode, the feedback signal representing the voltage output of the charge pump circuit to control the voltage output of the charge pump circuit based on the feedback signal; and setting the first capacitor to a first predefined voltage and setting the second capacitor to a second predefined voltage in the second operation mode.

In Example 15 the method of Example 14 may optionally further include: providing a clock signal to the control circuit.

In Example 16 the method of Example 15 may optionally further include: controlling the clock signal based on the feedback signal to provide a pump clock signal to the charge pump circuit 102.

In Example 17 the method of Example 15 or 16 may optionally further include: providing the pump clock signal to the charge pump circuit in the case the voltage output represented by the feedback signal is in a first predefined voltage range.

In Example 18 the method of Example 17 may optionally further include: suppressing the pump clock signal in the case the voltage output represented by the feedback signal is in a second predefined voltage range different from the first predefined voltage range.

Example 19 is a method for operating a charge pump arrangement, the method including: alternating a first operation mode and a second operation mode of the charge pump arrangement to control a voltage output of a charge pump circuit; sensing the voltage output of the charge pump circuit via a first voltage divider circuit and sensing the voltage output of the charge pump circuit via a second voltage divider circuit, the first voltage divider circuit including at least two first capacitors coupled in a series arrangement and the second voltage divider circuit including at least two second capacitors coupled in a series arrangement; providing a first feedback signal via the first voltage divider circuit in the first operation mode, the first feedback signal representing the voltage output of the charge pump circuit to control the voltage output based on the first feedback signal; setting the at least two second capacitors of the second voltage divider circuit to predefined voltages in the first operation mode; providing a second feedback signal via the second voltage divider circuit in the second operation mode, the second feedback signal representing the voltage output of the charge pump circuit to control the voltage output based on the second feedback signal; and setting the at least two first capacitors of the first voltage divider circuit to predefined voltages in the second operation mode.

In Example 20 the method of Example 19 may optionally include that setting the at least two first capacitors and the at least two second capacitors to predefined voltages including coupling the capacitors to a set of reference potentials respectively.

In Example 21 the method of Example 20 may optionally further include: checking if the output voltage represented by the first feedback signal or the second feedback signal respectively is in a voltage range defined by a reference voltage, and controlling the voltage output of the charge pump circuit in the first operation mode via the first feedback signal and in the second operation mode via the second feedback signal based on a result of the comparison. The reference voltage that may be compared with the respective feedback signal may or may not have the value of the output voltage. The reference voltage may be a scaled version of the desired output voltage. Further, the reference voltage may be a digital representation as long the control circuit perform an analog-to-digital conversion of the feedback signal or/and digital-to-analog conversion of the reference voltage.

Example 22 is a method for operating a charge pump arrangement, the method including: providing an output voltage 102v via a charge pump circuit 102 based on a pump clock signal 102c and an input voltage 102i; providing a feedback signal 106c via a feedback path 116, the feedback signal 106c representing the output voltage 102v of the charge pump circuit 102; providing a clock signal 110c; modifying the pump clock signal 102c based on the feedback signal 106c and the clock signal 110c to control the output voltage 102v of the charge pump circuit 102.

Example 23 is a charge pump arrangement 100, including: a charge pump circuit 102 configured to convert an input voltage 102i into an output voltage 102v based on a pump clock signal 102c; a control circuit 104 configured to control the output voltage 102v of the charge pump circuit 102 by adjusting the pump clock signal 102c based on a feedback signal 106c; a voltage divider circuit 106 coupled to the charge pump circuit 102 to sense the output voltage 102v and further coupled to the control circuit 104 to provide the feedback signal 106c, wherein the voltage divider circuit 106 includes a first capacitor 106a and a second capacitor 106b coupled in a series arrangement, wherein the feedback signal 106c is tapped between the first capacitor 106a and the second capacitor 106b.

In Example 24, the charge pump arrangement of Example 23 may optionally include that the control circuit 104 is configured to receive a clock signal 110c and to control an output of the pump clock signal 102c to the charge pump circuit 102.

According to various embodiments, the feedback path 106 may include or may be a metal line. According to various embodiments, the feedback path 106 may include or may be a feedback circuit.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A charge pump arrangement, comprising:
   a charge pump circuit configured to convert an input voltage into an output voltage based on a pump clock signal;
   a feedback path configured to provide a feedback signal representing the output voltage of the charge pump circuit;
   a control circuit configured to receive a clock signal and to control the output voltage of the charge pump circuit by controlling the pump clock signal based on the feedback signal and the clock signal;
   wherein the feedback path comprises a voltage divider circuit, wherein the voltage divider circuit is coupled to the charge pump circuit to sense the output voltage and further coupled to the control circuit to provide the feedback signal; wherein the voltage divider circuit comprises a first capacitor and a second capacitor coupled in a series arrangement, wherein the feedback signal is tapped between the first capacitor and the second capacitor;
   additional voltage divider circuit to sense the output voltage of the charge pump circuit and to provide an additional feedback signal for the control circuit; wherein the additional voltage divider circuit comprises a third capacitor and a fourth capacitor coupled in a series arrangement, wherein the additional feedback signal is tapped between the third capacitor and the fourth capacitor; and
   a switch arrangement configured to switch the charge pump arrangement into a first operation mode and into a second operation mode by switching between the feedback signal of the voltage divider circuit and the additional feedback signal of the additional voltage divider circuit.

2. The charge pump arrangement of claim 1,
   wherein the control circuit is configured to operate discontinuously according to the clock signal.

3. The charge pump arrangement of claim 1,
   wherein the control circuit is configured to compare the output voltage represented by the feedback signal with a reference voltage; and, based on a result of the comparison, either to allow the output of the pump clock signal to the charge pump circuit, or to suppress the output of the pump clock signal to the charge pump circuit.

4. The charge pump arrangement of claim 3,
   wherein the control circuit is configured to allow the output of the pump clock signal in the case that the output voltage represented by the feedback signal is in a first predefined voltage range.

5. The charge pump arrangement of claim 4,
   wherein the control circuit is further configured to suppress the output of the pump clock signal in the case the output voltage represented by the feedback signal is in a second predefined voltage range different from the first predefined voltage range.

6. The charge pump arrangement of claim 1,
   wherein the control circuit is configured to perform a detection action and a control action with a predefined phase shift relative to each other.

7. The charge pump arrangement of claim 1, further comprising:
   a switch arrangement configured to alternatingly switch the charge pump arrangement into a first operation mode and into a second operation mode.

8. The charge pump arrangement of claim 7,
   wherein, in the first operation mode, the voltage divider circuit is configured to sense the output voltage of the charge pump circuit and to provide the feedback signal; and
   wherein, in the second operation mode, the first capacitor and the second capacitor of the voltage divider circuit are coupled to a set of reference potentials to set the first capacitor to a first predefined voltage and to set the second capacitor to a second predefined voltage.

9. The charge pump arrangement of claim 1,
   wherein, in the first operation mode, the voltage divider circuit is configured to sense the output voltage of the charge pump circuit and to provide the feedback signal to the control circuit,
   wherein, in the first operation mode, the third capacitor and the fourth capacitor of the additional voltage divider circuit are coupled to a set of reference potentials to set the third capacitor to a third predefined voltage and to set the fourth capacitor to a fourth predefined voltage; and
   wherein, in the second operation mode, the additional voltage divider circuit is configured to sense the output voltage of the charge pump circuit and to provide the additional feedback signal to the control circuit,
   wherein, in the second operation mode, the first capacitor and the second capacitor of the voltage divider circuit are coupled to a set of reference potentials to set the first capacitor to a first predefined voltage and to set the second capacitor to a second predefined voltage.

10. A method for operating a charge pump arrangement, the method comprising:
    providing a clock signal to a control circuit, the control circuit configured to receive the clock signal and to control a voltage output of a charge pump circuit by controlling the clock signal based on a feedback signal and the clock signal, wherein the feedback signal represents the voltage output of a charge pump circuit to provide a pump clock signal to the charge pump circuit;
    alternating a first operation mode and a second operation mode of the charge pump arrangement to control the voltage output of a charge pump circuit;
    sensing the voltage output of the charge pump circuit via a voltage divider circuit, the voltage divider circuit comprising a first capacitor and a second capacitor coupled in a series arrangement, providing a feedback signal via the voltage divider circuit in the first operation mode, the feedback signal representing the voltage output of the charge pump circuit, to control the voltage output of the charge pump circuit based on the feedback signal; and setting the first capacitor to a first predefined voltage and setting the second capacitor to a second predefined voltage in the second operation mode;

tapping the feedback signal between the first capacitor and the second capacitor;

sensing the output voltage of the charge pump circuit via an additional voltage divider circuit and providing an additional feedback signal for the control circuit, wherein the additional voltage divider circuit comprises a third capacitor and a fourth capacitor coupled in a series arrangement;

further comprising tapping the additional feedback signal between the third capacitor and the fourth capacitor; and switching the charge pump arrangement into a first operation mode and into a second operation mode via a switch arrangement by switching between the feedback signal of the voltage divider circuit and the additional feedback signal of the additional voltage divider circuit.

11. The method of claim 10, further comprising:

providing the pump clock signal to the charge pump circuit in the case the voltage output represented by the feedback signal is in a first predefined voltage range.

12. The method of claim 11, further comprising:

suppressing the pump clock signal in the case the voltage output represented by the feedback signal is in a second predefined voltage range different from the first predefined voltage range.

* * * * *